United States Patent
Wu

(10) Patent No.: US 8,933,486 B2
(45) Date of Patent: Jan. 13, 2015

(54) GAN BASED HEMTS WITH BURIED FIELD PLATES

(75) Inventor: Yifeng Wu, Goleta, CA (US)

(73) Assignee: Cree, Inc., Durham, NC (US)

(*) Notice: Subject to any disclaimer, the term of this patent is extended or adjusted under 35 U.S.C. 154(b) by 0 days.

(21) Appl. No.: 13/245,579

(22) Filed: Sep. 26, 2011

(65) Prior Publication Data

US 2012/0049243 A1 Mar. 1, 2012

Related U.S. Application Data

(63) Continuation of application No. 11/901,103, filed on Sep. 13, 2007, now Pat. No. 8,283,699.

(60) Provisional application No. 60/858,851, filed on Nov. 13, 2006.

(51) Int. Cl.
| | |
|---|---|
| *H01L 29/778* | (2006.01) |
| *H01L 29/40* | (2006.01) |
| *H01L 29/423* | (2006.01) |
| *H01L 29/66* | (2006.01) |
| *H01L 29/812* | (2006.01) |

(52) U.S. Cl.
CPC ............ *H01L 29/778* (2013.01); *H01L 29/402* (2013.01); *H01L 29/42316* (2013.01); *H01L 29/66462* (2013.01); *H01L 29/8128* (2013.01)
USPC ........... 257/194; 257/183; 257/192; 257/195; 257/196

(58) Field of Classification Search
USPC ........... 257/183, 192, 194, 195, 196, E29.091
See application file for complete search history.

(56) References Cited

U.S. PATENT DOCUMENTS

| | | | |
|---|---|---|---|
| 4,290,077 A | 9/1981 | Ronen | ........................... 257/409 |
| 4,551,905 A * | 11/1985 | Chao et al. | ................... 438/570 |
| 4,766,474 A | 8/1988 | Nakagawa et al. | |

(Continued)

FOREIGN PATENT DOCUMENTS

| | | |
|---|---|---|
| CN | 1321340 A | 11/2001 |
| CN | 1428870 A | 7/2003 |

(Continued)

OTHER PUBLICATIONS

Office Action from Taiwanese Patent Application No. 094114829. dated May 29, 2012.

(Continued)

*Primary Examiner* — Long K Tran
*Assistant Examiner* — Jordan Klein
(74) *Attorney, Agent, or Firm* — Koppel, Patrick, Heybl & Philpott

(57) ABSTRACT

A transistor with source and drain electrodes formed in contact with an active region and a gate between the source and drain electrodes and in contact with the active region. A first spacer layer is on at least part of the active region surface between the gate and drain electrodes and between the gate and source electrodes. The gate comprises a generally t-shaped top portion that extends toward the source and drain electrodes. A field plate is on the spacer layer and under the overhang of at least one section of the gate top portion. The field plate is at least partially covered by a second spacer layer that is on at least part of the first active layer surface and between the gate and drain and between the gate and source. At least one conductive path electrically connects the field plate to the source electrode or the gate.

12 Claims, 4 Drawing Sheets

(56) References Cited

U.S. PATENT DOCUMENTS

| | | | |
|---|---|---|---|
| 4,946,547 A | 8/1990 | Palmour et al. | |
| 4,947,232 A | 8/1990 | Ashida et al. | 357/53 |
| 5,053,348 A * | 10/1991 | Mishra et al. | 438/571 |
| 5,187,552 A | 2/1993 | Hendrickson et al. | 257/408 |
| 5,192,987 A | 3/1993 | Khan et al. | 257/183.1 |
| 5,196,359 A | 3/1993 | Shih et al. | 437/40 |
| 5,200,022 A | 4/1993 | Kong et al. | |
| 5,290,393 A | 3/1994 | Nakamra | |
| 5,296,395 A | 3/1994 | Kahn et al. | |
| RE34,861 E | 2/1995 | Davis et al. | |
| 5,393,993 A | 2/1995 | Edmond et al. | |
| 5,399,886 A | 3/1995 | Hasegawa | 257/192 |
| 5,470,767 A * | 11/1995 | Nakamoto et al. | 438/570 |
| 5,523,589 A | 6/1996 | Edmond et al. | |
| 5,569,937 A | 10/1996 | Bhatnagar | 257/77 |
| 5,652,179 A | 7/1997 | Strifler et al. | 438/578 |
| 5,686,738 A | 11/1997 | Moustakas | |
| 5,701,019 A * | 12/1997 | Matsumoto et al. | 257/192 |
| 5,710,455 A | 1/1998 | Bhatnagar et al. | 257/472 |
| 5,739,554 A | 4/1998 | Edmond et al. | |
| 5,780,900 A | 7/1998 | Suzuki et al. | 257/335 |
| 5,929,467 A * | 7/1999 | Kawai et al. | 257/192 |
| 5,959,307 A | 9/1999 | Nakamura et al. | 257/14 |
| 6,033,948 A | 3/2000 | Kwon et al. | 438/217 |
| 6,057,564 A | 5/2000 | Rennie | 257/99 |
| 6,100,571 A * | 8/2000 | Mizuta et al. | 257/488 |
| 6,127,703 A | 10/2000 | Letavic et al. | 257/347 |
| 6,140,169 A | 10/2000 | Kawai et al. | 438/197 |
| 6,242,766 B1 * | 6/2001 | Tateno | 257/194 |
| 6,307,232 B1 | 10/2001 | Akiyama et al. | 257/347 |
| 6,316,793 B1 | 11/2001 | Sheppard et al. | |
| 6,346,451 B1 | 2/2002 | Simpson | 438/311 |
| 6,355,951 B1 | 3/2002 | Hattori | 257/280 |
| 6,445,038 B1 | 9/2002 | Tihanyi | |
| 6,468,878 B1 | 10/2002 | Petruzzello et al. | 438/454 |
| 6,475,857 B1 | 11/2002 | Kim | 438/240 |
| 6,483,135 B1 * | 11/2002 | Mizuta et al. | 257/283 |
| 6,495,409 B1 | 12/2002 | Manfra et al. | 438/216 |
| 6,548,333 B2 | 4/2003 | Smith et al. | |
| 6,559,513 B1 | 5/2003 | Miller et al. | 257/488 |
| 6,586,781 B2 | 7/2003 | Wu et al. | 257/194 |
| 6,586,813 B2 | 7/2003 | Nagahara | 257/472 |
| 6,620,688 B2 | 9/2003 | Woo et al. | 438/262 |
| 6,621,121 B2 * | 9/2003 | Baliga | 257/330 |
| 6,624,488 B1 | 9/2003 | Kim | 257/411 |
| 6,627,473 B1 * | 9/2003 | Oikawa et al. | 438/46 |
| 6,686,616 B1 * | 2/2004 | Allen et al. | 257/280 |
| 6,690,042 B2 | 2/2004 | Khan et al. | 257/192 |
| 6,740,535 B2 * | 5/2004 | Singh et al. | 438/18 |
| 6,838,325 B2 * | 1/2005 | Whelan et al. | 438/172 |
| 6,870,219 B2 | 3/2005 | Brech | |
| 6,891,235 B1 | 5/2005 | Furukawa et al. | 257/480 |
| 6,902,964 B2 | 6/2005 | Sriram | |
| 6,933,544 B2 * | 8/2005 | Saito et al. | 257/194 |
| 6,940,090 B2 | 9/2005 | Saito et al. | 257/20 |
| 6,972,440 B2 * | 12/2005 | Singh et al. | 257/194 |
| 7,012,286 B2 * | 3/2006 | Inai et al. | 257/192 |
| 7,038,252 B2 * | 5/2006 | Saito et al. | 257/192 |
| 7,071,498 B2 | 7/2006 | Johnson et al. | 257/192 |
| 7,075,125 B2 | 7/2006 | Saito et al. | 257/194 |
| 7,126,426 B2 * | 10/2006 | Mishra et al. | 330/307 |
| 7,170,111 B2 | 1/2007 | Saxler | |
| 7,229,903 B2 | 6/2007 | Li et al. | 438/571 |
| 7,282,423 B2 | 10/2007 | Furukawa et al. | 438/422 |
| 7,465,967 B2 | 12/2008 | Smith et al. | 257/194 |
| 7,501,669 B2 | 3/2009 | Parikh et al. | 257/194 |
| 7,508,015 B2 * | 3/2009 | Saito et al. | 257/192 |
| 7,550,783 B2 * | 6/2009 | Wu et al. | 257/194 |
| 7,800,131 B2 * | 9/2010 | Miyamoto et al. | 257/192 |
| 7,812,369 B2 | 10/2010 | Chini et al. | 257/192 |
| 7,863,648 B2 * | 1/2011 | Miyamoto et al. | 257/192 |
| 8,120,066 B2 * | 2/2012 | Lanzieri et al. | 257/194 |
| 2001/0015446 A1 | 8/2001 | Inoue et al. | |
| 2001/0023964 A1 | 9/2001 | Wu et al. | |
| 2002/0005528 A1 | 1/2002 | Nagahara | |
| 2002/0017648 A1 | 2/2002 | Kasahara et al. | |
| 2002/0105028 A1 | 8/2002 | Fujihira | 257/339 |
| 2002/0137318 A1 | 9/2002 | Peake et al. | |
| 2002/0139995 A1 | 10/2002 | Inoue et al. | 257/194 |
| 2002/0145172 A1 | 10/2002 | Fujishima et al. | |
| 2002/0155646 A1 | 10/2002 | Petruzzello et al. | |
| 2002/0167023 A1 | 11/2002 | Chavarkar et al. | |
| 2003/0006437 A1 * | 1/2003 | Mizuta et al. | 257/283 |
| 2003/0020092 A1 | 1/2003 | Parikh et al. | |
| 2003/0075719 A1 | 4/2003 | Sriram | 257/77 |
| 2003/0107081 A1 | 6/2003 | Lee et al. | |
| 2003/0132463 A1 | 7/2003 | Miyoshi | |
| 2003/0183844 A1 * | 10/2003 | Yokoyama et al. | 257/192 |
| 2003/0222327 A1 | 12/2003 | Yamaguchi et al. | |
| 2004/0021152 A1 * | 2/2004 | Nguyen et al. | 257/192 |
| 2004/0021175 A1 | 2/2004 | Brech | |
| 2004/0029330 A1 * | 2/2004 | Hussain et al. | 438/172 |
| 2004/0124435 A1 * | 7/2004 | D'Evelyn et al. | 257/103 |
| 2004/0188775 A1 | 9/2004 | Peake et al. | 257/397 |
| 2004/0201038 A1 | 10/2004 | Kimura et al. | |
| 2004/0227211 A1 | 11/2004 | Saito et al. | |
| 2005/0051796 A1 * | 3/2005 | Parikh et al. | 257/192 |
| 2005/0051800 A1 | 3/2005 | Mishra et al. | 257/202 |
| 2005/0062069 A1 | 3/2005 | Saito et al. | 257/213 |
| 2005/0082611 A1 | 4/2005 | Peake et al. | 257/341 |
| 2005/0110042 A1 | 5/2005 | Saito et al. | |
| 2005/0124100 A1 * | 6/2005 | Robinson | 438/167 |
| 2005/0133818 A1 | 6/2005 | Johnson et al. | 257/192 |
| 2005/0189559 A1 | 9/2005 | Saito et al. | |
| 2005/0208722 A1 | 9/2005 | Peake et al. | 438/259 |
| 2005/0253168 A1 * | 11/2005 | Wu et al. | 257/192 |
| 2006/0006415 A1 | 1/2006 | Wu et al. | 257/194 |
| 2006/0011915 A1 | 1/2006 | Saito et al. | 257/65 |
| 2006/0043416 A1 * | 3/2006 | Li et al. | 257/192 |
| 2006/0071247 A1 | 4/2006 | Chen et al. | |
| 2006/0081877 A1 | 4/2006 | Kohji et al. | 257/194 |
| 2006/0202272 A1 * | 9/2006 | Wu et al. | 257/355 |
| 2007/0102727 A1 | 5/2007 | Twynam | |
| 2007/0235775 A1 | 10/2007 | Wu et al. | |
| 2010/0314666 A1 | 12/2010 | Saito et al. | |
| 2012/0132959 A1 | 5/2012 | Parikh et al. | 257/194 |
| 2012/0235156 A1 | 9/2012 | Kuraguchi | |

FOREIGN PATENT DOCUMENTS

| | | |
|---|---|---|
| CN | 1639875 A | 7/2005 |
| EP | 0069429 | 1/1983 |
| EP | 0792028 A2 | 6/1997 |
| EP | 0792028 | 8/1997 |
| EP | 1336989 | 8/2003 |
| EP | 1336989 A2 | 8/2003 |
| JP | 03035536 | 2/1991 |
| JP | 05021793 A | 1/1993 |
| JP | 6349859 A | 12/1994 |
| JP | 07050413 | 2/1995 |
| JP | 07176544 | 7/1995 |
| JP | 09232827 | 9/1997 |
| JP | 11008256 | 1/1999 |
| JP | 1197455 | 4/1999 |
| JP | 11233525 | 8/1999 |
| JP | 11274174 | 10/1999 |
| JP | 11274174 A | 10/1999 |
| JP | 2000003919 | 1/2000 |
| JP | 2000082671 | 3/2000 |
| JP | 2000100831 A | 4/2000 |
| JP | 2001160656 | 6/2001 |
| JP | 2001189324 | 7/2001 |
| JP | 2002016245 | 1/2002 |
| JP | 2002100642 | 4/2002 |
| JP | 2000270620 | 9/2002 |
| JP | 2002270830 A | 9/2002 |
| JP | 2002343814 | 11/2002 |
| JP | 2003100775 | 4/2003 |
| JP | 2003188189 | 7/2003 |
| JP | 2003203923 | 7/2003 |
| JP | 2003297854 | 10/2003 |
| JP | 2005507174 | 3/2005 |
| JP | 2005093864 | 4/2005 |
| JP | 2005527102 A | 9/2005 |

(56) References Cited

FOREIGN PATENT DOCUMENTS

| | | |
|---|---|---|
| JP | 2005535113 | 11/2005 |
| JP | 2005340417 | 12/2005 |
| JP | 2007019560 | 1/2007 |
| TW | 334632 B | 6/1998 |
| TW | 552712 B | 9/2003 |
| TW | 579600 B | 3/2004 |
| TW | I2230978 B | 4/2005 |
| WO | WO 9908323 | 2/1999 |
| WO | WO 02093650 | 11/2002 |
| WO | WO 03036729 A1 | 5/2003 |
| WO | WO 03038905 A2 | 5/2003 |
| WO | WO 2004068590 A1 | 8/2004 |
| WO | WO 2006025971 | 7/2005 |
| WO | WO 2005114743 | 12/2005 |
| WO | WO 2006025971 | 3/2006 |

OTHER PUBLICATIONS

European Examination Report Application No. 05731252.2-2203 Dated: Jul. 30, 2008.
First Office Action from China, Application No. 200480032782.1, Dated Jul. 18, 2008.
Saito, et al., "Theoretical limit estimation of lateral wide band-gap semiconductor power-switching device", Solid-State Electronics 48 (2004), pp. 1555-1562.
International Search Report, PCT/JP03/00843, dated Mar. 28, 2003.
Second Office Action from related China Application No. 200580015278.5, Dated: Dec. 19, 2008.
Communication Pursuant to Article 94(3) EPC re: related European Application No. 07018026.0.
Patent Abstracts of Japan, Pub. No. 07176544, Pub. Date: Jul. 14, 1995.
Official Notice of Final Decision of Rejection re Japan Patent App. No. 2006-526270, Dated: Jan. 23, 2009.
First Examination Report from related European Appl. No. 04 788 642.9-2203.
Second Office Action from related Chinese Appl. No. 200480032782.1, dated: Dec. 28, 2009.
Office Action from related U.S. Appl. No. 11/078,265, dated Jan. 20, 2010.
Office Action from related U.S. Appl. No. 11/807,701, dated Jan. 26, 2010.
Notification of Rejection/Objection for Chinese Patent Appl. No. 200580014868.6, dated Aug. 11, 2010.
Office Action for European Patent Appl. No. 05735109.0 dated Aug. 27, 2010.
Extended Search Report for European Patent Appl. No. 10183441.4 dated Nov. 24, 2010.
Extended Search Report for European Patent Appl. No. 10183607.0 dated Nov. 29, 2010.
Notice Requesting Submission of Opinion in counterpart Korean Patent Appl. No. 10-2006-7004682, dated Feb. 17, 2011.
PCT International Preliminary Report for Group related Applications, Appl. No. PCT/US05/09984, dated Aug. 25, 2008.
Office Action from European Patent Appl. No. 05756258.9, Jun. 10, 2010.
Wu et al. "High Al Content AlGaN/GaN HEMTs With Very High Performance", IEDM 1999 Digest pp. 925-927, Washington, D.C. Dec. 1999.
IEEE Transactions on Electron Devices, vol. 48, No. 3 Mar. 2001, p. 581-585.
Kahn et al., "AlGaN/GaN Metal-Oxide-Semiconductor Heterostructure Field-Effect Transistors on SIC Substrates", Applied Physics Letters, American Institute of Physics. New York, US, vol. 77, No. 9, Aug. 2000, p. 1339-1341, XP000951319 ISSN: 0003-6951.
Lu et al. "P-Type SiGe Transistors With Low Gate Leakage Using Sin Gate Dielectric", IEEE Electron Device Letters, IEEE, Inc., New York, US, vol. 20, No. 10, Oct. 1999, p. 514-516, XP000890470, ISSN: 0741-3106.
Zhang N-Q et al., "High Breakdown GaN HEMT With Overlapping Gate Structure", IEEE Electron Device Letters, IEEE, Inc. New York, US, vol. 9, Sep. 2000, p. 373-375, XP000954354, ISSN: 0741-3106.
Third Office Action from related Chinese Application No. 200580014866.7, dated:Oct. 30, 2009.
Chinese Patent Appl. No. 200580014868.6, second Office Action dated Feb. 24, 2010.
Examiner's First Report on Patent Appl. Re related Australian Appl. No. 2005246697, dated Mar. 19, 2010.
International Search Report, PCT/US05/26064, dated: Jan. 6, 2006.
International Search Report, PCT/US98/16295, dated: Dec. 15, 1998.
International Search Report, PCT/US2005/012821, dated Mar. 29, 2006.
First Office Action re related Chinese Application No. 200580015278.5, Dated: May 9, 2008.
Office Action for Korean Patent Appl. No. 10-2006-7026207, mailed Jul. 26, 2011.
Office Action for Taiwan Patent Appl. No. 094111532, dated Jul. 4, 2011.
Extended Examination Report for European patent Appl. No. EP05731252.2, May 5, 2011.
Office Action for Taiwan Patent Appl. No. TW09312733, Apr. 29, 2011.
Office Action for Korean Patent Appl. No. KR 10-2006-7026090, May 17, 2011.
Japanese Patent Application No. 2003-081849 (Laid-open No. 2004-289038) Patent Abstracts of Japan.
Official Notice of Rejection mailed on Jun. 24, 2008, Japanese Patent Application No. 2006-526270 and comments.
Japanese Patent Application Laid-open No. 2001230407 Patent Abstracts of Japan.
Japanese Patent Application Laid-open No. 2002-343814 Patent Abstracts of Japan.
Japanese Patent Application Laid-open No. 63-087773 Patent Abstracts of Japan.
Japanese Patent Application Laid-open No. 2001-230263 Patent Abstracts of Japan.
Japanese Patent Application No. 2003-307916 (Laid-open No. 2005-079346) Patent Abstracts of Japan.
CRC Press, *The Electrical Engineering Handbook*, Second Edition, DORF, (1997) p. 994.
B. Gelmont, K. Kim, and M. Shur. "Monte Carlo Simulation of Electron Transport in Gallium Nitrate." *Journal of Applied Physics*, vol. 74, Issue 3, (Aug. 1, 1993) p. 1818.
R. Gaska, J.W. Yang, A. Osinsky, Q. Chen, M.A. Khan, A.O. Orlov, G.L. Snider, M.S. Shur. "Electron Transport in ALGaN Heterostructures Grown on 6H-SiC Substrates." *Applied Physics Letters*, vol. 72, No. 6 (Feb. 9, 1998) p. 707.
Y. F. Wu et. al. "GaN-Based FETs for Microwave Power Amplification." *IEICE Transactions on Electronics*, E-82-C, (1999) p. 1895.
Y.F. Wu, D. Kapolnek, J.P. Ibettson, P. Parikh, B.P. Keller, and U.K. Mishra. "Very-High Power Density ALGaN/GaN HEMTs." *IEEE Transactions on Electronic Devices*, vol. 48, Issue 3 (Mar. 2001) p. 586.
M. Micovic, A. Kurdoghlian, P. Janke, P. Hashimoto, D.W.S. Wong, J. S. Moon, L. McRay, and C. Nguyen. "ALGaN/GaN Heterojunction Field Effect Transistors Grown by Nitrogen Plasma Assisted Molecular Beam Epitaxy." *IEEE Transactions on Electronic Devices*, vol. 48, Issue 3, (Mar. 2001) p. 591.
Gaska et al., "High Temperature Performance of AlGaN/GaN HFET's on SiC Substrates." *IEEE Electron Device Letters* vol. 18, No. 10, (Oct. 1997) p. 492.
Ping et al., "DC and Microwave Performance of High Current AlGaN Heterostructure Field Effect Transistors Grown on P-Type SiC Substrates." *IEEE Electron Device Letters* vol. 19, No. 2, (Feb. 1998) p. 54.
L. Eastman, K. Chu, J. Smart, J. R. Shealy, "GaN Materials for High Power Microwave Amplifiers." *Materials Research Society* vol. 512 Wocsemmad, Monterey, CA (Feb. 1998) p. 3-7.
G. Sullivan et al., "High Power 10-GHz Operation of AlGaN HFET's in Insulating SiC." *IEEE Electron Device Letters* vol. 19, No. 6, (Jun. 1998) p. 198.

(56) References Cited

OTHER PUBLICATIONS

Wu et al., "High AL-Content ALGaN/GaN MODFETs for Ultrhigh Performance." *IEEE Electron Device Letters* vol. 19, No. 2, (Feb. 1998) p. 50.
Y. Ando, et al., "10-W/mm AlGaN-GaN HFET with a Field Modulating Plate." *IEEE Electron Device Letters* vol. 24, No. 5, (May 2003) p. 289-292.
S. Karmalkar, U.K. Mishra, "Very High Voltage AlGaN/GaN High Electron Mobility Transistors Using a Field Plate Deposited on a Stepped Insulator." *Solid-State Electronics* vol. 45, (2001) pp. 1645-1652.
W. Saito et al., "600V ALGaN/GaN Power-HEMT: Design, Fabrication and Demonstration on High Voltage DC-DC Converter." *IEEE IEDM* vol. 23, No. 7, (2003) pp. 587-590.
Wu et al., "High-Gain Microwave GaN HEMTs With Source-Terminated Field-Plates", CREE Santa Barbara Technology Center.
Wu at al., "30-W/MM GaN HEMTs by Field Plate Optimization", IEEE,vol. 25, No. 3, Mar. 2004, p. 117-119.
Saito et al. Solid State Electronics, Theoretical Limit Estimation of Lateral Wide Bandgap Semiconductor Power-Switching Device Apr. 1, 2003, p. 1555-1562.
Tilak, et al., "Effect of Passivation on AlGaN/GaN HEMT Device Performance" 2000 IEEE International Symposium on Compound Semiconductors. Proceedings of the IEEE $27^{th}$ International Symposium on Compound Semiconductors (Cat. No. $00^{th}$ 8498), 2000 IEEE International Symposium on Compound Semiconductors Proceedings of the, p. 357-363, XP002239700, 2000 Piscataway, NJ, USA, IEEE, US ISBN: 0-7803-6258-6.
Office Action from related family, U.S. Appl. No. 11/807,701, dated Aug. 22, 2008.
Office Action from related family, U.S. Appl. No. 10/958,970, dated Sep. 10, 2008.
Saito et al. "High Breakdown Voltage AlGaN—GaN Power HEMT Design and High Current Density Switching Behavior", IEEE Transactions on Electron Devices, Vol. 50, No. 12, Dec. 2003, pp. 2528-2531.
Heikman et al. "Growth of Fe Doped Semi-Insulating GaN by Metalorganic Chemical Vapor Deposition". Applied Physics Letters, Vol. 81, No. 3, Jul. 2002, pp. 439-441.
Heikman, Growth and Characteristics of Fe-Doped GaN, Journal of Crystal Growth 248 (2003), 513-517.
Asano K et al: "Novel High Power AlGaAs/GaAs HFET with a Field-Modulating Plate Operated at 35 V Drain Voltage", Electron Devices Meeting, 1998. IDM '98 Technical Digest. International San Francisco, CA USA Dec. 6-9, 1998, Piscataway, NJ, USA IEEE US, Dec. 6, 1998, pp. 59-62 XP010321500.
Wakejima A et al, "High Power Density and Low Distortion Ingap Channel FETs With Field-Modulating Plate", IEICE Transactions on Electronics, Institute of Electronics Information and Comm. Eng. Tokyo, JP, vol. E85-C, No. 12, Dec. 2002, pp. 2041-2045, XP001161324.
Mor P K T et al, "A Novel High-Voltage High-Speed MESFET Using a Standard GAAS Digital IC Process" IEEE Transactions on Electron Devices, IEEE Inc. New York, US. vol. 41, No. 2, Feb. 1, 1994, pp. 246-250, XP000478051.
Li J, et al "High Breakdown Voltage GaN HFET With Field Palte" Electronics Letters, IEE Stevenage, GB vol. 37, No. 3, Feb. 1, 2001, pp. 196-197, XP006016221.
Xing H. et al. "High Breakdown Voltage AlGaN—GaN HEMTs Achieved by Multiple Field Plates" IEEE Electron Device Letters, IEEE Inc. New York, US. vol. 25, No. 4, Apr. 2004, pp. 161-163, XP001190361.
Saito at al. "Design and Demonstration of High Breakdown Voltage GaN High Electron Mobility Transistor (HEMT) Using Field Plate Structure for Power Electronics Applications", Japanese Journal of Applied Physics, Japan Society of Applied Physics, Tokyo, JP vol. 43, No. 4B, Apr. 2004 pp. 2239-2242, XP001227744, ISSN: 0021-4922.
Office Action from U.S. Appl. No. 10/786,755, dated Jun. 22, 2011.
Office Action from U.S. Appl. No. 11/807,701, dated May 18, 2010.
Office Action from U.S. Appl. No. 11/807,701, dated Jan. 26, 2010.
Office Action from U.S. Appl. No. 12/321,493, dated Aug. 18, 2010.
Office Action from U.S. Appl. No. 12/321,493, dated Jun. 23, 2011.
Office Action from U.S. Appl. No. 12/321,493, dated Jan. 26, 2011.
Office Action from U.S. Appl. No. 12/437,505, dated Jul. 21, 2010.
Office Action from U.S. Appl. No. 12/497,468, dated Aug. 18, 2011.
Office Action from U.S. Appl. No. 12/497,468, dated Mar. 7, 2011.
Office Action from U.S. Appl. No. 10/958,945, dated Sep. 23, 2011.
Office Action from U.S. Appl. No. 10/958,945, dated Apr. 1, 2011.
Office Action from U.S. Appl. No. 10/958,945, dated Sep. 1, 2010.
Office Action from U.S. Appl. No. 10/958,945, dated Jan. 28, 2010.
Office Action from U.S. Appl. No. 11/078,265, dated Jun. 15, 2011.
Office Action from U.S. Appl. No. 11/078,265, dated Jan. 20, 2010.
Office Action from U.S. Appl. No. 11/600,617, dated Dec. 22, 2009.
Office Action from U.S. Appl. No. 11/584,135, dated Jun. 15, 2011.
Office Action from U.S. Appl. No. 11/901,103, dated Feb. 11, 2011.
Office Action from U.S. Appl. No. 11/901,103, dated Jun. 8, 2010.
Summary of Decision of Rejection for Japanese Application No. 2007-513132, dated Mar. 13. 2012.
Decision of Rejection from Taiwanese Application No. 094111532. dated Apr. 11, 2012.
Office Action and Search Report from Taiwanese Patent Application No. 093127333. dated Jul. 5, 2012.
Office Action and Search Report from Taiwanese Patent Application No. 095103561, dated Jul. 24, 2012.
"High Power Density and Low Distortion InGaP Channel FET's with Field-Modulating Plate". Wakejima, at al.. IEICE Trans Electron. vol. E85-C. No. 12. Dec. 2002, pp. 2041-2045.
"Very high voltage AlGaN/GaN high electron mobility transistors using a field plate deposited on a stepped insulator", Karmalker, et al.. Solid-State Electronics 45 (2001) pp. 1645-1652.
Extended European Search Report from Appl. No. 11183396-8-2203/2432021. dated: Feb. 22, 2012.
Extended European Search Report from Appl. No. 11183404.0-2203. dated: Feb. 28, 2012.
Examiner's Report from Canadian Appl. No. 2566361. Dated: Feb. 7, 2012.
Extended European Search Report from Application No. 11183655.7-2203. dated: Mar. 1, 2012.
Examiner's Report for Canadian Patent Application No. 2,566,756, dated Feb. 16, 2012.
Examiner's Report for Canadian Patent Application No. 2,564,955, dated Feb. 24, 2012.
Summary of "Notice of Reasons for Rejection". Japanese Patent Application No. 2008-500703, dated Jan. 10, 2012.
Summary of "Notice of Reasons for Rejection", Japanese Patent Application No. 2007-238147, dated Jan. 24, 2012.
Interrogation from Japanese Patent Application No. 2007-513132, dated Sep. 25, 2012.
Notice of Reasons for Rejection for Japanese Patent Appl. No. 2007-513167, dated Jan. 9, 2013.
European Search Report from European Patent Application No. 12171403.4-2203/2515339, dated Nov. 12. 2012.
European Search Report from European Patent Application No. 12171401.8-2203/2515338, dated Nov. 13, 2012.
Decision of Rejection from Japanese Patent Application No. 2008-500703, dated Nov. 20, 2012.
Decision of Rejection from Japanese Patent Application No. 2007-513155, dated Nov. 13. 2012.
Examination Report for European Patent Application No. 05756258.9 dated Dec. 11, 2012.
Office Action from Taiwanese Patent Application No. 094111532, dated Nov. 23, 2012.
Pretrial Examination Communication from Examiner from Japanese Patent Appl. No. 2008-500703, Appeal No. 2013-05298, dated Jun. 3, 2013.
Office Action from U.S. Appl. No. 10/958,945, dated May 15, 2013.
Response to Office Action U.S. Appl. No. 10/958,945, dated Mar. 14, 2013.
Office Action from U.S. Appl. No. 10/958,945, dated Mar. 14, 2013.
Office Action from U.S. Appl. No. 12/497,468, dated Mar. 12, 2013.
Response to Office Action U.S. Appl. No. 12/497,468, dated Nov. 20, 2012.

(56) References Cited

OTHER PUBLICATIONS

Office Action from U.S. Appl. No. 12/497,468, dated Nov. 20, 2012.
Office Action from U.S. Appl. No. 13/072,449, dated Dec. 13, 2012.
Response to Office Action U.S. Appl. No. 13/072,449, filed Feb. 13, 2013.
Interrogation from Japanese Patent Application No. 2007-513155, dated Jun. 25, 2013.
Decision of Rejection from Japanese Patent appl. No. 2007-513167, dated Jul. 4, 2013.
Office Action from Taiwanese Patent Appl. No. 095103561, dated Jun. 27, 2013.
First Office Action from Chinese Patent Appl. No. 2011102654868, dated Jun. 19, 2013.
Notice of Reasons for Rejection from Japanese Patent Appl. No. 2007-513132, dated Jun. 25. 2013.
Office Action from Japanese Patent Appl. No. 2008-500703, dated Jun. 25, 2013.
A.J. Bergsma, "A Comprehensive Design Method for Dual Gate MOSFET Mixers", Ottawa Carleton Institute for Electrical Engineering, Dept. of Electronics, Carleton University, Ottawa, Canada, May 1995. © 1998 AJ Bergsma.
Vetury, et al., "Performance and RF Reliability of GaN—ON—SiC HEMTs Using Dual-Gate Architectures". Air Force Research Laboratory, Jul. 2006, Air Force Contract No. FA8650-05-C-5411, Wright-Patterson Air Force Base, OH 45433-7750.
Office Action from Taiwanese Patent Appl. No. 101131917, dated Jul. 26, 2013.
Examination Report from European Patent Appl. No. 06 718 166.9, dated Aug. 13, 2013.
Office Action from U.S. Appl. No. 10/958,945, dated Aug. 16, 2013.
Office Action from U.S. Appl. No. 11/078,265, dated Aug. 15, 2013.
Office Action from U.S. Appl. No. 13/355,766, dated Aug. 9, 2013.
Examination Report from Canadian Patent Appl. No. 2,566,756, dated Nov. 7, 2013.
European Search Report from European Patent Appl. No. 12180744.0-1552, dated Dec. 12, 2013.
Examination Report from Canadian Patent Appl. No. 2,564,955, dated Dec. 6, 2012.
Notice of Reasons for Rejection from Japanese Patent Appl. No. 2008-500703, dated Nov. 12, 2013.
Reason for Rejection from Japanese Patent Appl. No. 2012-157890, dated Dec. 24, 2013.
European Search Report from European Patent Appl. No. EP 2 538 446 A3, Published Jan. 15, 2014.
Reasons for Rejection from Japanese Patent Appl. No. 2012-107672, dated Dec. 24, 2013.
Reasons for Rejection from Japanese Patent Appl. No. 2012-117726, dated Dec. 24, 2013.
Second Office Action from Chinese Patent Appl. No. 201110265486.8, dated Mar. 13, 2014.
Notice of Reasons for Rejection from Japanese Patent Appl. No. 2007-513167, dated Feb. 4, 2014.
Appeal Decision from Japanese Patent Appl. No. 2007-513155, dated Mar. 11, 2014.
Office Action from U.S. Appl. No. 13/355,766, dated Mar. 5, 2014.
Office Action from U.S. Appl. No. 10/958,945, dated Mar. 31, 2014.
Decision from Taiwanese Patent Appl. No. 095103561 dated Mar. 31, 2014.
Office Action from Japanese Patent Appl. No. 2013-050780, dated Jul. 1, 2014.
Third Office Action from Chinese Patent Appl. No. 200580014868.6, dated Jul. 2, 2014.
Office Action from U.S. Appl. No. 10/958,945, dated Nov. 14, 2013.
Response to OA from U.S. Appl. No. 10/958,945, filed Jan. 10, 2014.
Office Action from U.S. Appl. No. 11/078,265, dated Apr. 28, 2014.
Further Examination on European Patent Appl. No. 04 788 624.9, dated Aug. 5, 2014.
Decision of Patent Grant and Allowed Claims from Japanese Patent Appl. No. 2007-513167, dated Aug. 5, 2014.
International Search Report and Written Opinion from PCT/US2014/037728, dated Aug. 18, 2014.
International Search Report and Written Opinion from Appl. No. PCT/US2014/041171, dated Sep. 22, 2014.
R. Vetury. et al., "Performance and RF Reliability of GaN-on-SiC HEMT's using Dual-Gate Architectures", RF Micro Devices. Charlotte, NC, 28269, p. 714.
Office Action from U.S. Appl. No. 13/355,766, dated Jul. 30, 2014.
Third Office Action from Chinese Appl. No. 201110265486.8, dated Sep. 17. 2014.
Decision of Rejection from Japanese Appl. No. 2012-157890, dated Oct. 21, 2014.
Communication from European Appl. No. 07 018 026.0—1552, dated Oct. 14, 2014.

* cited by examiner

GAN BASED HEMTS WITH BURIED FIELD PLATES

This application is a continuation of U.S. application Ser. No. 11/901,103, filed on 13 Sep. 2007, now U.S. Pat. No. 8,283,699 which claims the benefit of U.S. Provisional Application Ser. No. 60/858,851, filed on Nov. 13, 2006.

Subject matter of this application was developed with government support under Contract No. ONR 03-C-0092. The government has certain rights in inventions described herein.

BACKGROUND OF THE INVENTION

1. Field of the Invention

The present invention relates to transistors and particularly to transistors utilizing field plates to improve performance.

2. Description of the Related Art

Improvements in the manufacturing of AlGaN/GaN semiconductor materials have helped advance the development of AlGaN/GaN transistors, such as high electron mobility transistors (HEMTs) for high frequency, high temperature and high power applications. AlGaN/GaN has large bandgaps, high peak and saturation electron velocity values [B. Gelmont, K. Kim and M. Shur, *Monte Carlo Simulation of Electron Transport in Gallium Nitride*, J. Appl. Phys. 74, (1993), pp. 1818-1821]. AlGaN/GaN HEMTs can also have 2DEG sheet densities in excess of $10^{13}$ cm$^{-2}$ and relatively high electron mobility (up to 2019 cm$^2$/Vs) [R. Gaska, et al., *Electron Transport in AlGaN—GaN Heterostructures Grown on 6H—SiC Substrates*, Appl. Phys. Lett. 72, (1998), pp. 707-709]. These characteristics allow AlGaN/GaN HEMTs to provide very high voltage and high power operation at RF, microwave and millimeter wave frequencies.

AlGaN/GaN HEMTs have been grown on sapphire substrates and have shown a power density of 4.6 W/mm and a total power of 7.6 W [Y. F. Wu et al., *GaN-Based FETs for Microwave Power Amplification*, IEICE Trans. Electron. E-82-C, (1999). pp. 1895-1905]. AlGaN/GaN HEMTs have also been grown on SiC have shown a power density of 9.8 W/mm at 8 GHz [Y. F. Wu, et al., *Very-High Power Density AlGaN/GaN HEMTs*, IEEE Trans. Electron. Dev. 48, (2001), pp. 586-590] and a total output power of 22.9 W at 9 GHz [M. Micovic, et al., *AlGaN/GaN Heterojunction Field Effect Transistors Grown by Nitrogen Plasma Assisted Molecular Beam Epitaxy*, IEEE Trans. Electron. Dev. 48, (2001), pp. 591-596].

U.S. Pat. No. 5,192,987 to Khan et al. discloses GaN/AlGaN based HEMTs grown on a buffer and a substrate. Other AlGaN/GaN HEMTs and field effect transistors (FETs) have been described by Gaska et al., *High-Temperature Performance of AlGaN/GaN HFET's on SiC Substrates*, IEEE Electron Device Letters, 18, (1997), pp. 492-494; and Wu et al., *High Al-content AlGaN/GaN HEMTs With Very High Performance*, IEDM-1999 Digest, pp. 925-927, Washington D.C., December 1999. Some of these devices have shown a gain-bandwidth product ($f_T$) as high as 100 gigahertz [Lu et al., *AlGaN/GaN HEMTs on SiC With Over 100 GHz ft and Low Microwave Noise*, IEEE Transactions on Electron Devices, Vol. 48, No. 3, March 2001, pp. 581-585] and high power densities up to 10 W/mm at X-band [Wu et al., *Bias-dependent Performance of High-Power AlGaN/GaN HEMTs*, IEDM-2001, Washington D.C., Dec. 2-6, 2001] and [Wu et al., *High Al-Content AlGaN/GaN MODFETs for Ultrahigh Performance*, IEEE Electron Device Letters 19, (1998), pp. 50-53].

Electron trapping and the resulting difference between DC and RF characteristics can be a limiting factor in the performance of these devices. Silicon nitride (SiN) passivation has been employed to alleviate this trapping problem resulting in high performance devices with power densities over 10 W/mm at 10 Ghz. For example, U.S. Pat. No. 6,586,781 to Wu et al. discloses methods and structures for reducing the trapping effect in GaN-based transistors. However, due to the high electric fields existing in these structures, charge trapping can still be a concern.

Field plates have been used to enhance the performance of GaN-Based HEMTs at microwave frequencies and have exhibited performance improvement over non-field-plated devices [See S Kamalkar and U. K. Mishra, *Very High Voltage AlGaN/GaN High Electron Mobility Transistors Using a Field Plate Deposited on a Stepped Insulator*, Solid State Electronics 45, (2001), pp. 1645-1662]. Many field plate approaches have involved a field plate connected to the gate of the transistor with the field plate on top of the drain side of a channel. This can result in a reduction of the electric field on the gate-to-drain side of the transistor, thereby increasing breakdown voltage and reducing the high-field trapping effect. However, transistors with gate-to-drain field plates can exhibit relatively poor reliability performance, particularly at class C (or higher class) operation where the electric field on the source side of the gate becomes significant.

Still other field plate approaches have involved connecting the field plate to the source. Source-connected field plates offer a reduction in gate-to-drain capacitance, which consequently enhances the gain. This arrangement however increases gate to field plate capacitance, or gate to source capacitance because the field plate is connected to the source. With the field plate on top of the gate, it is difficult to increase the gate cross-section, which limits the gate conductance. The addition of gate-to-source capacitance can reduce device bandwidth while the limited gate conductance restricts the power-gain cutoff frequency.

SUMMARY OF THE INVENTION

The present invention provides transistors that operate with low gate-to-source and gate-to-drain capacitances, as well as a high gate conductance, which leads to increased device gain, bandwidth and operational frequencies. One embodiment of a transistor according to the present invention comprises an active region with a channel layer. Source and drain electrodes are in contact with the active region and a gate is between the source and drain electrodes and in contact with the active region. The gate comprises a generally t-shaped top portion with overhangs which enhances gate conductance. A first spacer layer is on at least part of said active layer between the gate and the drain electrode and between the gate and the source electrode. A source-connected field plate is on the first spacer layer under at least part of the t-shaped portion of the gate. A second spacer layer is on top of said first spacer layer, covering at least part of said field plate.

One embodiment of a high electron mobility transistor (HEMT) according to the present invention comprises a buffer layer and barrier layer arranged successively on a substrate, with a two dimensional electron gas (2DEG) layer at the heterointerface between the buffer layer and said barrier layer. A source and a drain electrode are included both making contact with the 2DEG layer, and a gate is included on the barrier layer between the source and drain electrodes. The gate comprises a generally t-shaped top that is integral to the gate and enhances gate conductance. A first dielectric layer is on at least part of the surface of the barrier layer between the gate and the drain electrode and between the gate and the source electrode, with the gate contacting the barrier layer through an opening in the first dielectric layer. A source-connected field plate is on the first dielectric layer under at least part of the t-shaped portion of the gate. A second dielectric layer is on top of said first dielectric layer, covering at least part of said field plate.

One embodiment of a high electron mobility transistor (HEMT) according to the present invention comprises a GaN layer and barrier layer arranged successively on a substrate, with a two dimensional electron gas (2DEG) layer at the heterointerface between the GaN layer and said barrier layer. A source and a drain electrode are included both making contact with the 2DEG, and a gate is included on the barrier layer between the source and drain electrodes. The gate comprises a t-shaped top that is integral to the gate and enhances gate conductance. A first spacer layer is on at least part of the surface of the barrier layer between the gate and the drain electrode and between the gate and the source electrode, with the gate opening contacting a recess in the barrier layer. A source-connected field plate is on the first spacer layer under at least part of the t-shaped portion of the gate. A second spacer layer is on top of said first spacer layer, covering at least part of said field plate.

One embodiment of a high electron mobility transistor (HEMT) according to the present invention comprises a buffer layer on a substrate and a barrier layer on the buffer layer, with a two dimensional electron gas (2DEG) layer at the heterointerface between the buffer layer and said barrier layer. An $In_xGa_{1-x}N$ layer is inserted in the buffer layer. A source and a drain electrode are included both making contact with the 2DEG, and a gate is included on the barrier layer between the source and drain electrodes. The gate comprises a generally t-shaped top that is integral to the gate and enhances gate conductance. A first dielectric layer is on at least part of the surface of the barrier layer between the gate and the drain electrode and between the gate and the source electrode. A source-connected field plate is on the first dielectric layer under at least part of the t-shaped portion of the gate. A second dielectric layer is on top of said first dielectric layer, covering at least part of said field plate.

These and other further features and advantages of the invention would be apparent to those skilled in the art from the following detailed description, taken together with the accompanying drawings, in which:

DETAILED DESCRIPTION OF THE INVENTION

Figure 1:
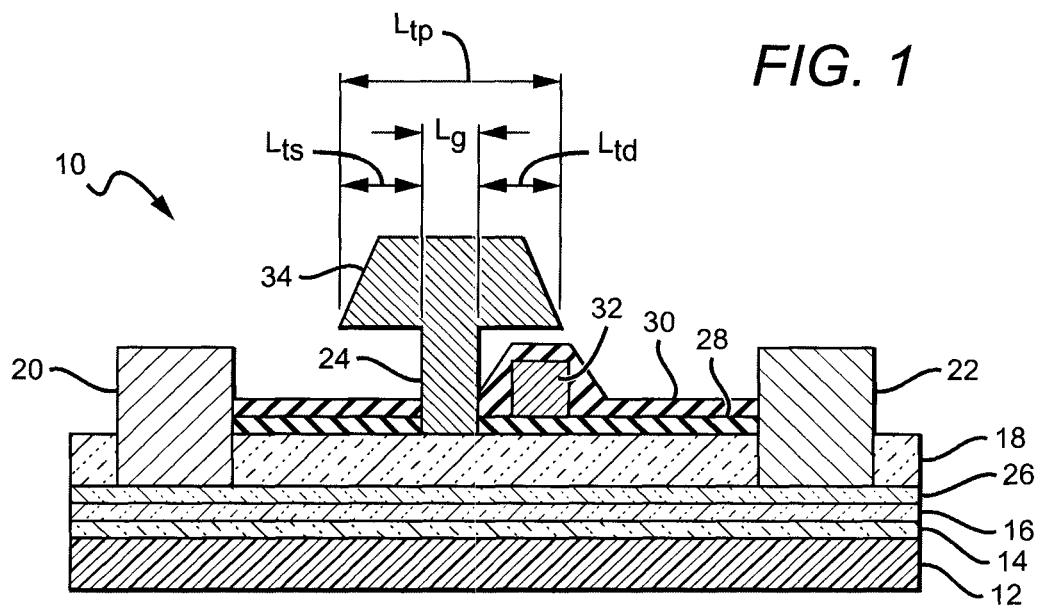
FIG. 1 is a sectional view of one embodiment of a HEMT according to the present invention.

The present invention provides structures for transistors, such as high electron mobility transistors (HEMTs) that provide lower gate-to-source and gate-drain capacitance, as well as high gate conductance. This results in devices having increased device gain, bandwidth and operational frequencies. The present invention is generally directed to transistors having a "T-shaped" gate with a field plate below or "buried" under one or both of the overhangs of the gate's T-shaped portion.

This arrangement can be used with many different transistor structures, such as transistor structures made of wide bandgap materials. Transistors generally include an active region having a plurality of semiconductor layers, one of which is a channel layer. The channel layer is often made of a two dimensional electron gas (2DEG). Metal source and drain electrodes are formed in contact with the active region, and a gate is formed on the active region between the source and drain electrodes for modulating electric fields within the active region.

A first spacer layer is formed above the active region, over at least a portion of the surface of the active region between the gate and the drain and at least a portion of the surface between the gate and the source. A second spacer layer is formed above the first spacer layer, over at least a portion of the surface of the first spacer layer region between the gate and the drain and at least a portion of the surface between the gate and the source. The first and second spacer layers can comprise a dielectric layer or a combination of multiple dielectric layers, and in certain embodiments other materials such as epitaxially grown layers.

In one embodiment the first spacer layer covers the topmost surface of the active region between the gate and the drain electrode, and between the gate and the source electrode. In other embodiments as described below the spacer layer can cover less of the surface of the active region.

A conductive first field plate is formed on the first spacer layer with the first spacer layer providing isolation between the field plate and the active region below. The first field plate extends a distance $L_{td}$ on the spacer layer from under the T-shaped portion on the drain side of the gate, toward the drain electrode. The first field plate can be electrically connected to either the source electrode or the gate. Additional spacer layer field and field plate pairs can also be included in different embodiments according to the invention. For example, a field plate can alternatively extend a distance $L_{ts}$ on the spacer layer from under the T-shaped portion on the source side of gate, toward the source electrode. In a preferred embodiment, there is a space between the lower surface of the gate's T-shaped portion and the layers below to minimize the capacitance between the gate and source.

In one embodiment the second spacer layer covers the entire field plate so that it is essentially buried, as well as covering the topmost surface of the first spacer layer region between the gate and the drain electrode, and between the gate and the source electrode. In other embodiments as described below the second spacer layer can cover less of the surface of the first spacer layer or less than all of the field plate. In still other embodiments the second spacer layer covers only the topmost surface of the second spacer layer region between the gate and the source and drain, and not the field plate.

This field plate arrangement can reduce the peak electric field, gate-to-source capacitance, and gate-to-drain capacitance, while also increasing gate conductance. Reducing the capacitances and increasing the gate conductance leads to increased device gain, bandwidth and operational frequencies as well as increased breakdown voltage and reduced trapping. The reduction of the electric field can also yield other benefits such as reduced leakage currents and enhanced reliability.

The source-connected field plate is arranged such that capacitance on the source side of the gate is reduced, which enhances performance and robustness for applications that require more negatively biased gate conditions. This includes class-C and other higher classes (e.g. E, F) of operations. By having the field plate connected to the source, capacitance on the drain side is reduced as well since the transistor experiences reduced peak electric field on the drain side.

One type of transistor that can utilize the buried source-connected field plate arrangement according to the present invention is a high electron mobility transistor (HENT), which typically includes a buffer layer and a barrier layer on the buffer layer. A two dimensional electron gas (2DEG) channel layer is located at the heterointerface between the buffer layer and the barrier layer. A gate electrode is formed on the barrier layer between source and drain electrodes. The HEMT also includes the multiple spacer layers and field plate arrangement described above.

Another type of transistor that can utilize the gate-source field plate arrangement according to the present invention is a field effect transistor and particularly a metal semiconductor field effect transistor (MESFET), which typically includes a buffer layer and a channel layer on the buffer layer. A gate is formed on the channel layer between source and drain electrodes, and the MESFET also includes the multiple spacer layer and field plate arrangement described above.

It will be understood that when an element or layer is referred to as being "on", "connected to", "coupled to" or "in contact with" another element or layer, it can be directly on, connected or coupled to, or in contact with the other element or layer or intervening elements or layers may be present. In contrast, when an element is referred to as being "directly on," "directly connected to", "directly coupled to" or "directly in contact with" another element or layer, there are no intervening elements or layers present. Likewise, when a first element or layer is referred to as being "in electrical contact with" or "electrically coupled to" a second element or layer, there is an electrical path that permits current flow between the first element or layer and the second element or layer. The electrical path may include capacitors, coupled inductors, and/or other elements that permit current flow even without direct contact between conductive elements.

Figure 2:
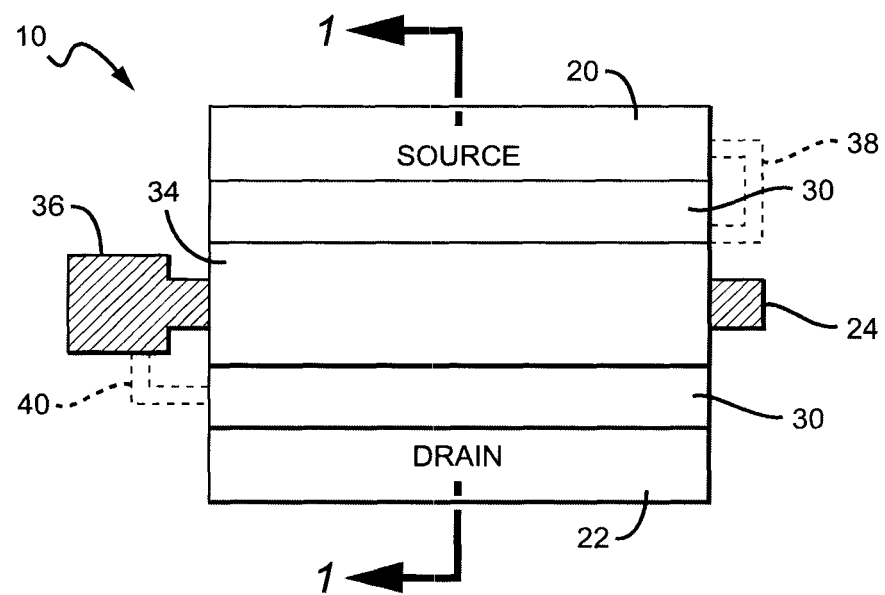
FIG. 2 is a plan view of the embodiment shown in FIG. 1.

FIGS. 1 and 2 show one embodiment of a HEMT 10 according to the present invention that is preferably Group-III nitride based, although other material systems can also be used. Group III nitrides refer to those semiconductor compounds formed between nitrogen and the elements in the Group III of the periodic table, usually aluminum (Al), gallium (Ga), and indium (In). The term also refers to ternary and tertiary compounds such as AlGaN and AlInGaN.

The HEMT 10 comprises a substrate 12 which can be made from silicon carbide, sapphire, spinet, ZnO, silicon, gallium nitride, aluminum nitride, or any other material or combinations of materials capable of supporting growth of a Group-III nitride material. A nucleation layer 14 can be formed on the substrate 12 to reduce the lattice mismatch between the substrate 12 and the next layer in the HEMT 10. The nucleation layer 14 should be approximately 1000 angstroms (Å) thick, although other thicknesses can be used. The nucleation layer 14 can comprise many different materials, with a suitable material being $Al_zGa_{1-z}N$ ($0<=z<=1$), and can be formed on the substrate 12 using known semiconductor growth techniques such as Metal Organic Chemical Vapor Deposition (MOCVD), Hydride Vapor Phase Epitaxy (HVPE), or Molecular Beam Epitaxy (MBE).

Substrate 12 can be made of many different materials with a suitable substrate being a 4H polytype of silicon carbide, although other silicon carbide polytypes can also be used including 3C, 6H and 15R polytypes. Silicon carbide has a much closer crystal lattice match to Group III nitrides than sapphire and results in Group III nitride films of higher quality. Silicon carbide also has a very high thermal conductivity so that the total output power of Group III nitride devices on silicon carbide is not limited by the thermal dissipation of the substrate (as may be the case with some devices formed on sapphire). Also, the availability of silicon carbide substrates provides the capacity for device isolation and reduced parasitic capacitance that make commercial devices possible. SiC substrates are available from Cree, Inc., of Durham, N.C. and methods for producing them are set forth in the scientific literature as well as in a U.S. Pat. No. Re. 34,861 to Davis et al.; U.S. Pat. No. 4,946,547 to Palmour et al.; and U.S. Pat. No. 5,200,022 to Kong et al.

The formation of a nucleation layer 14 can depend on the material used for the substrate 12. For example, methods of forming a nucleation layer 14 on various substrates are taught in U.S. Pat. No. 5,290,393 to Nakamura and U.S. Pat. No. 5,686,738 to Moustakas, each of which are incorporated by reference as if fully set forth herein. Methods of forming nucleation layers on silicon carbide substrates are disclosed in U.S. Pat. No. 5,393,993 to Edmond et al., U.S. Pat. No. 5,523,589 to Edmond et al., and U.S. Pat. No. 5,739,554 to Edmond et al., each of which is incorporated herein by reference as if fully set forth herein.

The HEMT 10 further comprises a high resistivity buffer layer 16 formed on the nucleation layer 14. The buffer layer 16 can comprise doped or undoped layers of Group III-nitride materials with a preferred buffer layer 16 made of a Group III-nitride material such as $Al_xGa_yIn_{(1-x-y)}N$ ($0<=x<=1$, $0<=y<=1$, $x+y<=1$). Other materials can also be used for the buffer layer 16 such as GaN that is approximately 0.5-20 μm thick, with part of the buffer layer doped with Fe.

A barrier layer 18 is formed on the buffer layer 16 with the buffer layer 16 being sandwiched between the barrier layer 18 and the nucleation layer 14. Like the buffer layer 16, the barrier layer 18 can comprise doped or undoped layers of Group III-nitride materials. The barrier layer can be made of one or multiple layers of $Al_xGa_{1-x}N$ or $Al_xIn_yGa_{1-x-y}N$, where x ranges from 0-1, and x can be a function of depth such that the barrier layer 18 can be a graded layer. A 2DEG channel layer 26 is induced at the heterointerface between the buffer layer 16 and the barrier layer 18, with the buffer layer 16, 2DEG channel layer 26 and barrier layer 18 generally forming the HEMTs active region.

Exemplary HEMT structures are illustrated in U.S. Pat. No. 6,316,793 to Sheppard et al., U.S. Pat. No. 6,586,781 to WU et al., U.S. Pat. No. 6,548,333 to Smith and U.S. Published Patent Application Nos. 2002/0167023 to Prashant et al., and 2003/0020092 to Parikh et al., each of which is incorporated by reference as though fully set forth herein. Other nitride based HEMT structures are illustrated in U.S. Pat. No. 5,192,987 to Kahn et al. and U.S. Pat. No. 5,296,395 to Kahn et al., each of which is incorporated herein by reference as if fully set forth herein. The buffer and barrier layers 16 and 18 can be made using the same methods used to grow the nucleation layer 14. Electric isolation between the devices is accomplished through mesa etch or ion implementation outside the active HEMT.

Metal source and drain electrodes 20, 22 are formed in contact with the barrier layer 18, and a gate 24 is formed on the barrier layer 18 through an opening in a first non-conducting spacer layer 28, between the source and drain electrodes 20, 22. Electric current can flow between the source and drain electrodes 20, 22 through the 2DEG channel layer 26 between the buffer layer 16 and the barrier layer 18 when the gate 24 is biased at the appropriate level. The formation of source and drain electrodes 20, 22 is described in detail in the patents and publications referenced above.

The source and drain electrodes 20, 22 can be made of different materials including but not limited to alloys of titanium, aluminum, gold or nickel. The gate 24 can also be made of different materials including but not limited to gold, nickel, platinum, titanium, chromium, alloys of titanium and tungsten, or platinum silicide. The gate 24 can have many different lengths ($L_g$), with a suitable gate length ranging from 10 nm to 1000 nm, although other gate lengths can also be used.

The first non-conducting spacer layer 28 is formed around the gate 24 and at least part of the surface of the barrier layer 18 between the gate 24 and the source and drain electrodes 20, 22. As shown in FIG. 1, the spacer layer 28 covers all of the barrier layer 18 between the gate 24 and source and drain electrodes 20, 22. The first spacer layer 28 can comprise a dielectric layer, or a combination of multiple dielectric layers. Different dielectric materials can be used such as a SiN, SiO2, Si, Ge, MgOx, MgNx, ZnO, SiNx, SiOx, alloys or layer sequences thereof. The first spacer layer can be many different thicknesses, with a suitable range of thicknesses being approximately 50 nm to 500 nm. As best shown in FIG. 2, the gate 24 is contacted at a gate contact 36.

The gate 24 also comprises a generally T-shaped top portion 34, which is larger than and integral to gate 24. The larger top portion 34 overhangs and has a larger cross-section than the gate, and as a result lower resistance and enhanced gate conductance. The top portion 34 and gate are generally T-shaped, but it is understood that these can comprise many different shapes. The objective is to include a section on the gate 24 to improve conductivity to allow for higher frequency operation, with the section being enlarged to achieve this objective. Having a particular shape to the enlarged top-portion is not critical.

The top portion 34 can also be made from a variety of materials, some of which can be the same or similar to the material for the gate 24 above. The overhangs of the top portion 34 can have many different lengths ($L_{tp}$), with a suitable length ranging from 0.2 um to 2 um, although other lengths can also be used. Additionally, the top portion 34 is either on or above the layers below it, and in the embodiment shown is either on or above the second spacer layer 30. In one embodiment, a space is provided between the top portion 34 and the spacer layer 30, which helps reduce capacitance between the gate and the source. The top portion 34 and gate can be fabricated using known photo-resist techniques, and in one embodiment a photo-resist layer can be included on the spacer layer 30 and the top portion formed on the photo-resist layer. Subsequent removal of the photo-resist layer leaves a space between the spacer layer and the top portion.

The second spacer layer 30 is formed on at least part of the surface of said first spacer layer 28 between the gate 24 and the source and drain electrodes 20, 22 and above at least part of a field plate 32. As shown in FIG. 1, the second spacer layer 30 covers all of the first spacer layer 28 between the gate 24 and source and drain electrodes 20, 22. The second spacer layer 30 can comprise a dielectric layer, or a combination of multiple dielectric layers. Different dielectric materials can be used such as a SiN, SiO2, Si, Ge, MgOx, MgNx, ZnO, SiNx, SiOx, alloys or layer sequences thereof. The second spacer layer 30 can be many different thicknesses, with a suitable range of thicknesses being approximately 50 nm to 500 nm.

The field plate 32 is formed on the spacer layer 28 under the overhangs of the gate top portion 34, with the field plate extending on the spacer layer 28 a distance $L_{fd}$ toward the drain electrode 22 as shown in FIG. 1, or alternatively a distance $L_{fs}$ toward the source electrode 20. The spacer layer 28 is arranged to provide isolation between the field plate 32 and the barrier layer 18, so the spacer layer 28 need only cover the barrier layer 18 below the first field plate 32. For ease of manufacturing, however, the spacer layer 28 typically covers the entire barrier layer 18. $L_{fd}$ can be different distances with a suitable range of distances being from 0.05-0.5 um. Similarly, $L_{fs}$ can be different distances with a suitable range of distances being from 0.05-0.5 um. In other embodiments, the field plates may not be continuous, but can have holes or interruptions as desired. The second spacer layer 30 can also cover the field plate 32.

The field plate 32 can comprise many different conductive materials with a suitable material being a metal or a stack of metal layers deposited using standard metallization methods. In one embodiment according to the present invention the field plate 32 comprises the same metal as the feature that it is electrically connected to as described below.

The field plate 32 can be electrically connected to either the source electrode 20 or the gate 24. FIG. 2 shows one embodiment where the first field plate 32 can be electrically connected to the source electrode 20 through a first conductive path 38 that runs outside the active region of the HEMT 10 and is connected to the source electrode 20. As shown in FIG. 2, the path 38 runs outside the active area of the HEMT at the edge opposite the gate contact 36. In alternative embodiments according to the present invention, the conductive path could run outside the active area of the HEMT 10 on the side of the gate contact 36, or the HEMT 10 could include two or more conductive paths running on one or both sides of the HEMT 10 (not shown). In one embodiment, the conductive paths can be made of the same material as the source electrode 20 and in other embodiments they can be made of a different material and can be formed at a different step in the fabrication process after formation of the source electrode 20. It is understood that this illustrates only one of the different ways that the field plate can be connected to the source according to the present invention.

Alternatively, the field plate 32 can also be electrically connected to the gate 24 by many different methods, with two suitable methods described herein. First, the field plate can be connected to the gate 24 by a second conductive path 40 that runs outside of the active region of the HEMT 10 between the field plate 32 and gate 24. The conductive path 40 can connect to the gate contact 36 or a portion of the gate 24 outside of the HEMTs active region, such as the portion of the gate 24 opposite the gate contact 36. Alternatively, more than one conductive path can be used to connect the field plate 32 and gate 24.

An alternative connection structure comprises conductive paths in the form of conductive vias (not shown), which can be formed running from the first field plate 32 to the gate 24, through the first or second spacer layers 28,30. The vias provide an electrical connection between the gate 24 and field plate 32 and the vias can be formed by first forming holes in the spacer layers 28,30, such as by etching, and then filling the holes with a conductive material either in a separate step or during formation of the field plate 32. The vias can be arranged periodically down the field plate 32 to provide for effective current spreading from the gate 24 to the field plate 32.

Figure 3:
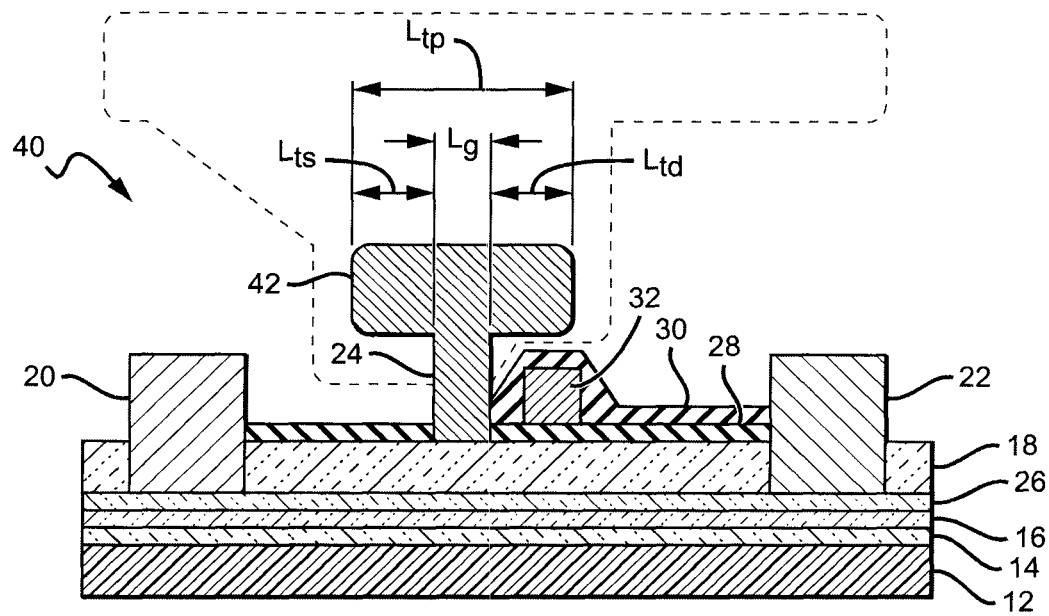
FIG. 3 is a sectional view of another embodiment of a HEMT according to the present invention.

FIG. 3 shows the HEMT 40 that is the same as the HEMT 10 of FIGS. 1 and 2, having many features that are similar to those in HEMT 10, and for those similar features the same reference numbers are used in describing this figure and those below. The HEMT 10 depicts the second non-conducting spacer layer 30 as being formed over the field plate 32 and over the portion of the first spacer layer 28 between the gate 24 and the drain 22, with the first spacer layer 28 between the gate 24 and the source 20 remaining uncovered by second spacer layer 30. It is understood that there are various embodiments whereby the second spacer layer 30 can cover less than the entire first spacer layer 28 between the gate 24 and the source 20 and between the gate 24 and the drain 22.

Additionally, the generally T-shaped top portion 42 of gate 24 in FIG. 3 is a different shape than the top portion 34 of FIGS. 1 and 2. It is understood that the top portion 34, 42 can comprise a variety of shapes and sizes in order to enhance gate conductance. The top portion 42 can also extend toward source 20 and drain 22 in varying degrees, with typical gate-to-source spacing from 0.05 um to 2 um and typical gate-to-drain spacing from 0 um to 3 um.

Figure 4:
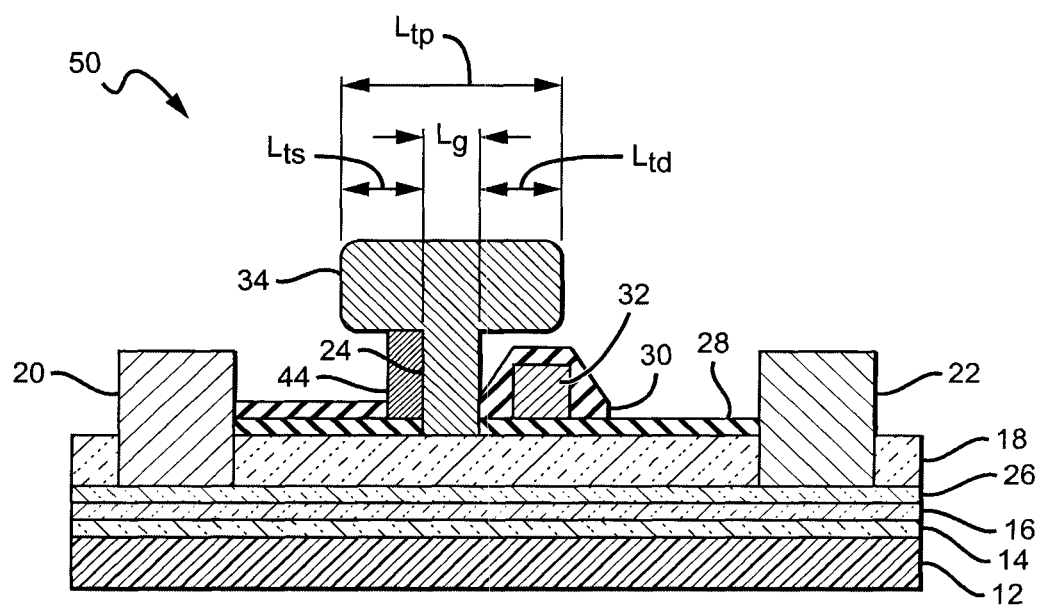
FIG. 4 is a sectional view of another embodiment of a HEMT according to the present invention having multiple field plates.

FIG. 4 shows another embodiment of a HEMT 50 according to the present invention having many features that are similar to those in HEMT 10, and for those similar features the same reference numbers are used. HEMT 50 comprises a substrate 12, nucleation layer 14, buffer layer 16, barrier layer 18, source electrode 20, drain electrode 22, gate 24 and 2DEG 26 channel layer, first spacer layer 28, second spacer layer 30 and gate top portion 34.

However, rather than just having one field plate 32 under the overhang of the drain side of top portion 34, a second field plate portion 44 can be deposited on the first spacer layer 28 or on the second spacer layer 30 (not shown). Different second field plates according to the present invention can provide different coverage, with the second field plate 44 as shown under the overhang of the top portion 34 between the source 20 and gate 24 and integral to the gate 24 and top portion 34. It is understood that many different field plate arrangements can be included, with the first spacer layer 28 covering all or less than the entire active layer and the second spacer layer 30 covering all or less than the entire first or second field plate 32,44 or all or less than the entire first spacer layer 28. In those embodiments where the second spacer layer 30 covers less than all of the first or second field plates 32,44 and/or spacer layer 28, the second spacer layer 30 must cover enough of the first or second field plates 32,44 to provide electrical isolation between the first and second field plates 32, 44.

The second field plate 44 can be connected to the source electrode 20 or the gate 24 and many different connecting structures can be used. Second conductive buses can be formed on the second spacer layer 30 to extend between the second field plate 44 and the source electrode 20. Different numbers of buses can be used so that current effectively spreads from the source electrode 20 into the second field plate 44, while not covering too much of the active region such that unwanted capacitance is introduced. The first field plate 32 can also be electrically connected to the source electrode 20 through a third conductive path that runs outside of the active region of the HEMTs 40 and is connected to the source electrode 20.

After deposition of the second field plate 44 and its connection to the source electrode 20, the active structure can be covered by a dielectric passivation layer (not shown), such as silicon nitride. Methods of forming the dielectric passivation layer are described in detail in the patents and publications referenced above. The HEMT 10 in FIGS. 1 and 2 and the transistors described below can also be covered by a dielectric passivation layer after formation of the spacer layer(s) and field plates(s).

Figure 5:
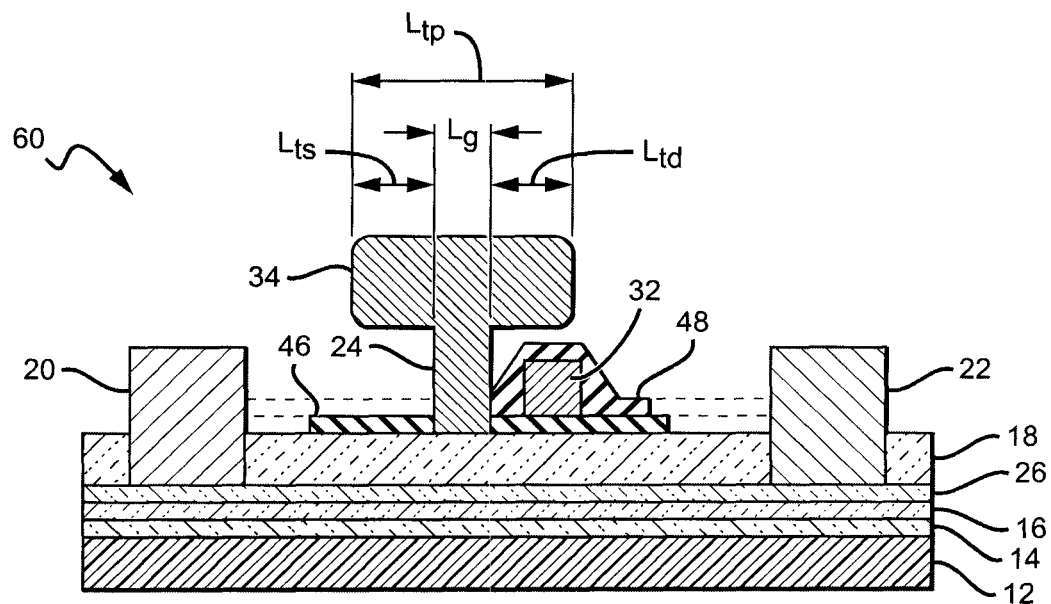
FIG. 5 is a sectional view of another embodiment of a HEMT according to the present invention having multiple field plates.

FIG. 5 shows another embodiment of a HEMT 60 according to the present invention having many features that are similar to those in HEMT 10, and for those similar features the same reference numbers are used. HEMT 60 comprises a substrate 12, nucleation layer 14, buffer layer 16, barrier layer 18, source electrode 20, drain electrode 22, gate 24 and 2DEG 26 channel layer, field plate 32 and gate top portion 34.

The HEMT 60, however, comprises a first spacer layer 46 that can cover less than the entire surface of the barrier layer 18 between the gate 24 and source 20 and/or between the gate 24 and drain 22. The coverage should be enough to provide electric isolation between the field plate 32 and the barrier layer 18. Additionally, a second spacer layer 48 can cover less than the entire surface of the first spacer layer 46 between the gate 24 and source 20 and/or between the gate 24 and drain 22.

Figure 6:
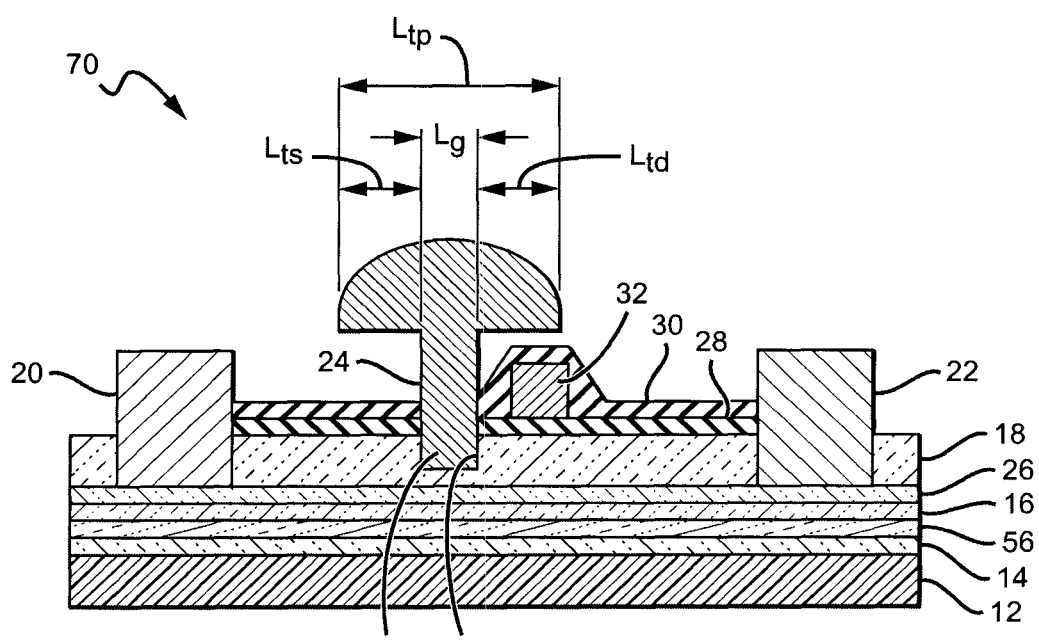
FIG. 6 is a sectional view of another embodiment of a HEMT according to the present invention having multiple field plates.

FIG. 6 shows another embodiment of a HEMT 70 according to the present invention having many features that are similar to those in HEMT 10. HEMT 70 comprises a substrate 12, nucleation layer 14, buffer layer 16, barrier layer 18, source electrode 20, drain electrode 22, gate 24, 2DEG 26 channel layer, first and second spacer layers 28,30, field plate 32 and gate top portion 34.

The HEMT 70, however, shows an alternative embodiment whereby a recess 52 into the barrier layer 18 accepts the lower portion 54 of gate 24. Moreover, an $In_xGa_{1-x}N$ layer 56 may be included, such as in the GaN buffer layer, to serve as an energy barrier. The layer can comprise other materials, and this arrangement is described in U.S. Pat. No. 7,170,111 to Saxler, which is incorporated herein by reference as if fully set forth herein.

Figure 7:
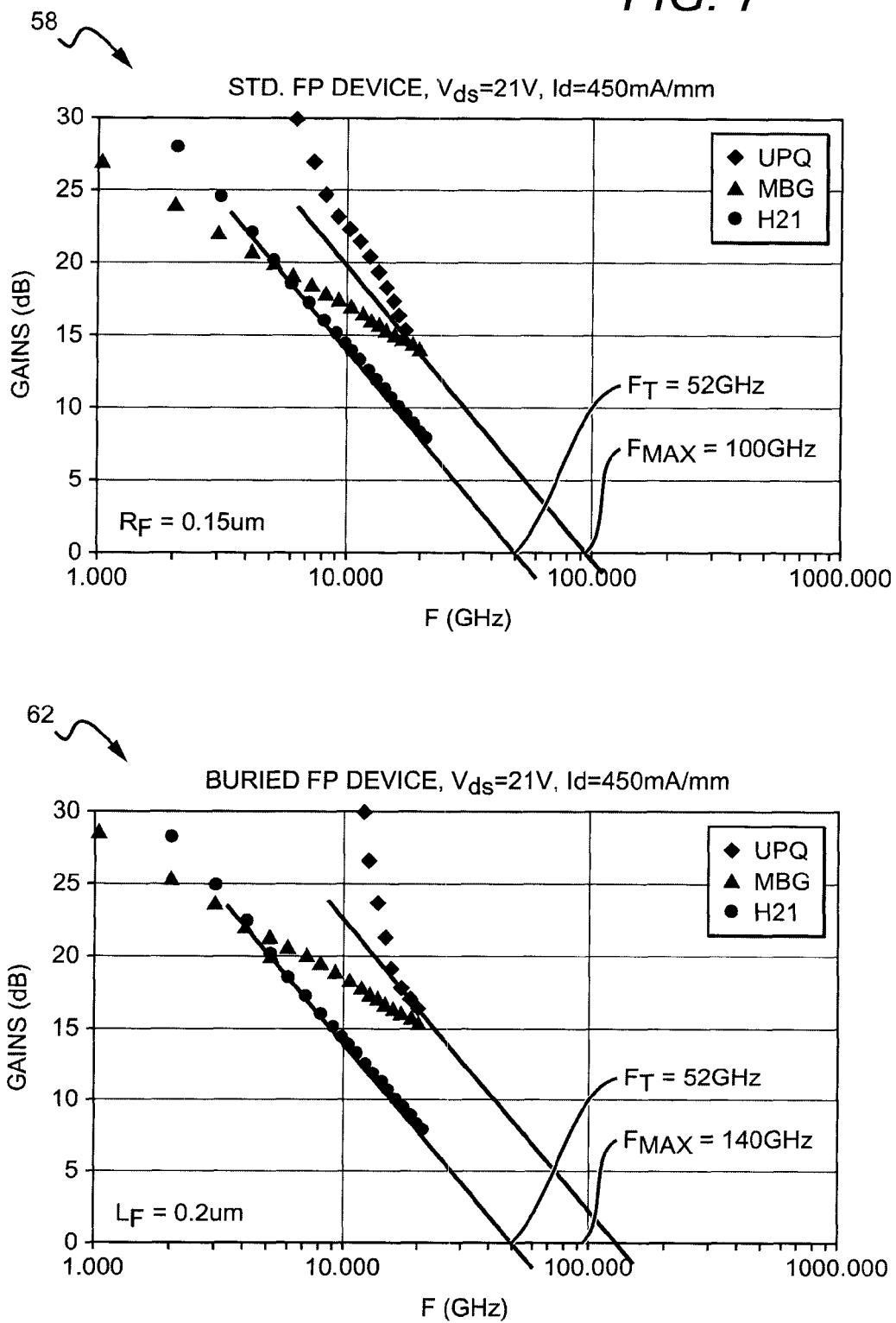
FIG. 7 is a table comparing the operating characteristics of a HEMT according to the present invention compared to a HEMT with no field gate-source field plate.

FIG. 7 shows tables 58 and 62, which depict gain plots of current-gain cut-off frequency (Ft) and power-gain cut-off frequency (Fmax) for two GaN HEMTS with standard gate-connected and with buried source-connected field plates. Tables 58 and 62 compare the operating characteristics of the GaN based HEMTs, and show that the Buried FP Device of table 62 exhibits 50% higher Fmax when compared to the Standard FP Device of table 58.

It is understood that the field plate arrangement can be applied to other transistors beyond HEMTs, including MESFETs and Metal Oxide Semiconductor Heterostructure Field Effect Transistor (MOSHFET). The field plate arrangement can also be applied to microwave and millimeter-wave power amplifiers for communication, instrumentation, military applications and so forth.

Although the present invention has been described in considerable detail with reference to certain preferred configurations thereof, other versions are possible. The buried field plate and gate arrangement can be used in many different devices. The field plates and gates can also have many different shapes and can be connected to the source contact in many different ways. Accordingly, the spirit and scope of the invention should not be limited to the preferred versions of the invention described above.

I claim:

1. A transistor device, comprising:
 a semiconductor structure comprising an active region, said active region comprising a barrier layer;
 a source electrode in electrical contact with said semiconductor structure;
 a drain electrode in electrical contact with said semiconductor structure; and
 a gate between said source and drain electrodes, said gate comprising a vertical portion and a horizontal portion, said vertical portion in a recessed area of said barrier layer, said horizontal portion on said semiconductor structure and extending toward said drain on one side and toward said source on another side, wherein at least a portion of a space between said gate horizontal portion and said semiconductor structure is filled with air.

2. The transistor device of claim 1, further comprising a first spacer layer between at least a portion of said gate and said semiconductor structure.

3. The transistor device of claim 2, further comprising a field plate electrically connected to said source electrode.

4. The transistor device of claim 3, wherein said field plate is electrically connected to said source electrode through at least one conductive bus.

5. The transistor device of claim 3, wherein said field plate is electrically connected to said source electrode through a conductive path that runs outside of the area defined by the footprint of the semiconductor structure.

6. The transistor device of claim 3, wherein said field plate is electrically connected to said source electrode through at least one conductive via.

7. The transistor device of claim 3, wherein said field plate is on said spacer layer.

8. The transistor device of claim 1, further comprising a substrate, said semiconductor structure on said substrate.

9. The transistor device of claim 1, wherein said gate is T-shaped.

10. The transistor device of claim 1, wherein said semiconductor structure comprises a buffer layer and a barrier layer.

11. The transistor of claim 1, wherein more than one surface of said vertical portion of said gate is in direct contact with the same layer of said active region.

12. A transistor device, comprising:
a semiconductor structure comprising an active region, said active region comprising a plurality of layers;
a source electrode in electrical contact with said semiconductor structure;
a drain electrode in electrical contact with said semiconductor structure; and
a gate between said source and drain electrodes, said gate comprising a vertical portion and a horizontal portion, said vertical portion in a recessed area of said semiconductor structure active region, wherein said gate is in direct contact with said active region, said horizontal portion on said semiconductor structure and extending toward said drain on one side and toward said source on another side, wherein at least a portion of a space between said gate horizontal portion and said semiconductor structure is filled with air.

* * * * *